(12) United States Patent
Rai et al.

(10) Patent No.: US 6,392,447 B2
(45) Date of Patent: *May 21, 2002

(54) SENSE AMPLIFIER WITH IMPROVED SENSITIVITY

(75) Inventors: Toshiki Rai; Sadao Yoshikawa, both of Gifu-ken (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,289

(22) Filed: Mar. 16, 1999

(30) Foreign Application Priority Data

Mar. 17, 1998 (JP) ............................................. 10-067354
Mar. 17, 1998 (JP) ............................................. 10-067355
Mar. 17, 1998 (JP) ............................................. 10-067356

(51) Int. Cl.[7] ................................................ H03F 1/08
(52) U.S. Cl. .......................................... 327/51; 327/56
(58) Field of Search ............................. 327/51, 52, 54, 327/56; 365/189.01, 189.09, 191, 207, 208

(56) References Cited

U.S. PATENT DOCUMENTS

| 4,799,195 | A | * | 1/1989 | Iwahashi et al. | ............ | 365/185 |
| 4,962,482 | A | * | 10/1990 | Jinbo | ..................... | 365/189.11 |
| 5,394,037 | A | * | 2/1995 | Josephson et al. | ............ | 327/51 |
| 5,537,356 | A | * | 7/1996 | Akaogi et al. | .............. | 365/205 |
| 5,737,273 | A | * | 4/1998 | Fujiwara et al. | ............ | 365/205 |
| 5,793,090 | A | * | 8/1998 | Gardner et al. | ............. | 257/408 |

* cited by examiner

Primary Examiner—Terry D. Cunningham
Assistant Examiner—Hai L. Nguyen
(74) Attorney, Agent, or Firm—Sheridan Ross P.C.

(57) ABSTRACT

A high speed sense amp supplies current to a bit line connected to a memory cell transistor and also detects a potential of the bit line. The potential of the bit line varies according to a conductive state of the memory cell transistor. The sense amp includes a load element and a first transistor connected in series between a first potential and the bit line. A second transistor is connected between the first potential and the bit line. The bit line is input to an inverter that has its output terminal connected to a gate of the first transistor. A differential amp has a first input terminal connected to a reference potential and a second input terminal connected to a node between the load element and the first transistor. The output of the differential amp indicates a difference between the reference potential and the bit line potential.

17 Claims, 6 Drawing Sheets

SENSE AMPLIFIER WITH IMPROVED SENSITIVITY

BACKGROUND OF THE INVENTION

The present invention generally relates to a sense amplifier (amp) connected to a memory cell transistor, and more particularly to a sense amp that reads the information stored in the memory cell transistor based on the difference in the threshold of the memory cell transistor.

Electrically Erasable and Programmable ROM (EEPROM) is available as an example of a single memory cell transistor. Each memory cell transistor has a double gate structure consisting of a floating gate and a control gate. When data is written to the memory cell transistor, hot electrons generated in the drain region are accelerated and injected into the floating gate. A difference arises between the operating characteristics of the memory cell transistor that injects electric charge into the floating gate and those of the memory cell transistor that does not inject electric charge into the floating gate. Data is read by detecting this difference.

FIG. 1 is a schematic circuit diagram illustrating a conventional sense amp 100, and FIG. 2 is an operating waveform diagram of the sense amp 100. The sense amp 100 determines the threshold of a memory cell transistor 105 based on the potential of a bit line.

The sense amp 100 comprises a differential amp 101, a P-channel type MOS transistor 102, an N-channel type MOS transistor 103, and a CMOS inverter 104. The transistor 102 is used as a read load and has a gate, a drain connected to the gate, and a source connected to a high potential power supply. The transistor 103 is connected between the drain of the transistor 102 and a bit line 106. The inverter 104 has an input terminal connected to the bit line 106 and an output terminal connected to the gate of the transistor 103. The differential amp 101 has an inverted input connected to the drain of the transistor 102, and a noninverted input connected to a reference potential Vref. The differential amp 101 outputs an output signal C indicating the determination result of the threshold of the memory cell transistor 105.

The memory cell transistor 105 changes its own threshold in accordance with the amount of electric charge stored in the floating gate. Desired data is stored in the memory cell transistor 105 by associating the change of threshold with storage data. In the read operation, the memory cell transistor 105 is selectively connected between the bit line 106 and the ground, and a selection signal LS is applied to the control gate.

In the initial state, the memory cell transistor 105 is nonselective (the control gate is off), and the bit line 106 is set to the ground potential. In such a state, as shown in FIG. 2, the power supply is started up at time t0. Thereupon, the drain potential Va of the transistor 102 rises up near to the power supply potential. The transistor 103 then goes on in response to the initial output startup of the inverter 104, and the potential VBL of the bit line 106 also rises together with the drain potential Va. When the inverter 104 slowly starts inversion as the potential VBL of the bit line 106 rises, the transistor 103 proceeds to the off state, and the potential VBL of the bit line 106 slowly rises. When a specific time L elapses from the power supply startup, the drain potential Va of the transistor 102 becomes stable. The potential Va after the transistor 102 has become stable is set to a higher potential than the threshold of the inverter 104 only for the threshold of the transistor 103. Thus the initial setup operation is completed.

After the initial setup has been completed, the selection signal LS is turned on and the control gate of the memory cell transistor 105 is turned on. Thereupon, the memory cell transistor 105 goes on or off according to the threshold. In other words, if the threshold of the memory cell transistor 105 is lower than the value of the selection signal LS, the memory cell transistor 105 goes on and the potential VBL of the bit line 106 decreases. If the threshold of the memory cell transistor 105 is higher than the value of the selection signal LS, the memory cell transistor 105 goes off and the potential VBL of the bit line 106 is maintained at a constant level.

When the memory cell transistor 105 goes on, the degree of drop in the potential VBL of the bit line 106 is determined based on the balance between the drive capacity of the memory cell transistor 105 and the drive capacities of the transistors 102 and 103. The drain potential Va of the transistor 102 also decreases together with the potential VBL of the bit line 106. The differential amp 101 compares the reference potential Vref and potential Va and detects the variation of the potential Va. The reference potential Vref is set within the variation range of the potential Va.

In the sense amp 100, as the drive capacity of the transistor 102 on the power supply side is set low, the variation of the drain potential Va increases and the sensitivity of the sense amp improves. However, if the drive capacity of the transistor 102 is set low, the current supplied to the bit line 106 through the transistor 103 when the power goes on is reduced. Accordingly, the time before the drain potential Va becomes stable (i.e., the initial setup time) is prolonged. As a result, the startup of the sense amp 100 is delayed, thereby impeding high-speed operation.

It is an object of the present invention to provide a sense amp with improved sensitivity and that is suitable for high-speed operation.

SUMMARY OF THE INVENTION

In one aspect of the invention, a sense amp is described for supplying a current to a bit line connected to a first potential through a memory cell transistor and detecting a potential of the bit line. The potential varies according to a conductive state of the memory cell transistor. The sense amp includes a load element and a first transistor connected in series between a second potential and the bit line. A second transistor is connected between the second potential and the bit line. The second transistor has a higher threshold than the first transistor. An inverter has an input terminal connected to the bit line and an output terminal connected to the gates of the first and second transistors. A differential amp has a first input terminal connected between the load element and the first transistor, a second input terminal connected to a reference potential, an output terminal that outputs a signal indicating the potential detection result of the bit line.

In another aspect of the invention, a sense amp is described for supplying a current to a bit line connected to a first potential through a memory cell transistor and detecting a potential of the bit line. The potential varies according to a conductive state of the memory cell transistor. The sense amp includes a load element and a first transistor connected in series between the second potential and the bit line. A second transistor is connected between a second power supply and the bit line. A first inverter has an input terminal connected to the bit line and an output terminal connected to the gate of the first transistor. A second inverter has an input terminal connected to the bit line and an output terminal connected to the gate of the second transistor. The second inverter has a lower threshold than the first inverter. A differential amp has a first input terminal connected to a node between the load element and the first transistor, a second input terminal connected to a reference potential, and an output terminal that outputs a signal indicating the potential detection result of the bit line.

In yet another aspect of the invention, a sense amp is described for supplying a current to a bit line connected to a first potential through a memory cell transistor and detecting a potential of the bit line. The potential varies according to a conductive state of the memory cell transistor. The sense amp includes a load element and a first transistor connected in series between a second potential and the bit line. A second transistor is connected between the second potential and the bit line. A switching transistor is connected between the second potential and the second transistor. An inverter has an input terminal connected to the bit line and an output terminal connected to the gates of the first and second transistors. A differential amp has a first input terminal connected to a node between the load element and the first transistor, a second input terminal connected to a reference potential, and an output terminal that outputs a signal indicating the potential detection result of the bit line.

In one aspect of the invention, a sense amp is described for supplying current to a bit line connected to a memory cell transistor and detecting a potential of the bit line. The potential varies according to a conductive state of the memory cell transistor. The sense amp includes a load element and a first transistor. The load element and the first transistor are connected in series between a first potential and the bit line. A second transistor is connected between the first potential and the bit line. The second transistor turns on when a current is supplied to the bit line. A first inverter has an input terminal connected to the bit line and an output terminal connected to a gate of the first transistor. A differential amp has a first input terminal connected to a reference potential, a second input terminal connected to a node between the load element and the first transistor, and an output terminal that outputs a signal indicating a difference between the reference potential and the bit line potential.

Other aspects and advantages of the invention will become apparent from the following description, taken in conjunction with the accompanying drawings, illustrating by way of example of the principles of the invention.

BRIEF DESCRIPTION OF THE DRAWINGS

The invention, together with objects and advantages thereof, may best be understood by reference to the following description of the presently preferred embodiments together with accompanying drawings in which.

DETAILED DESCRIPTION OF THE PREFERRED EMBODIMENTS

First Embodiment

Figure 1:
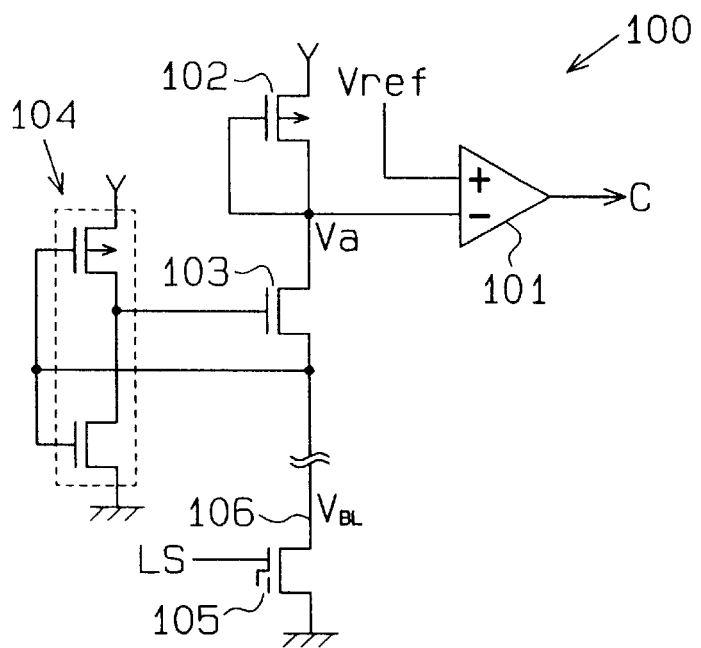
FIG. 1 is a circuit diagram of a conventional sense amp.
Figure 2:
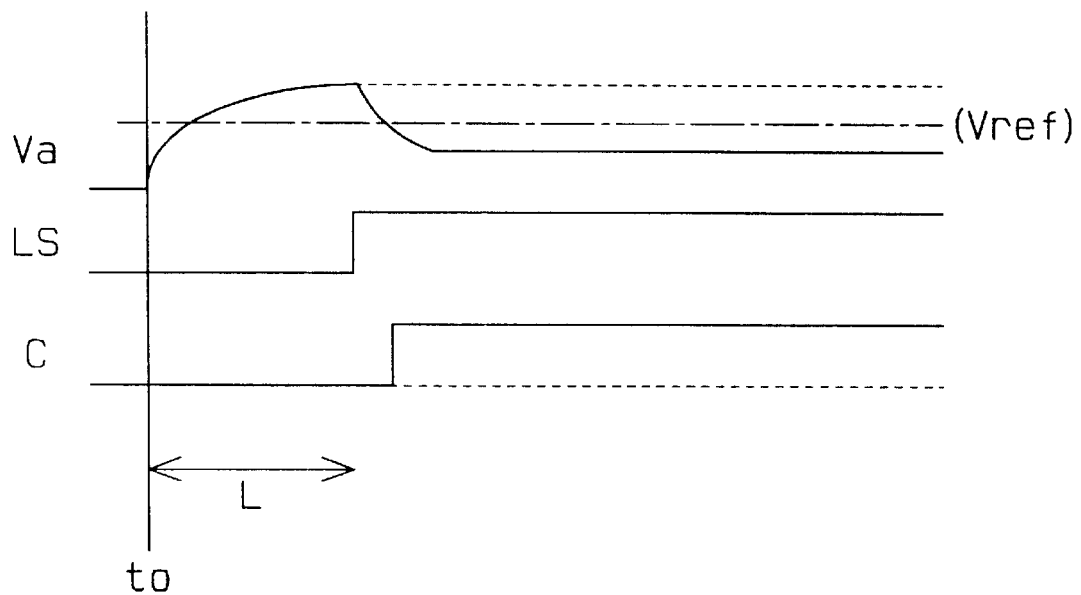
FIG. 2 is an operating waveform diagram of the sense amp of FIG. 1.
Figure 3:
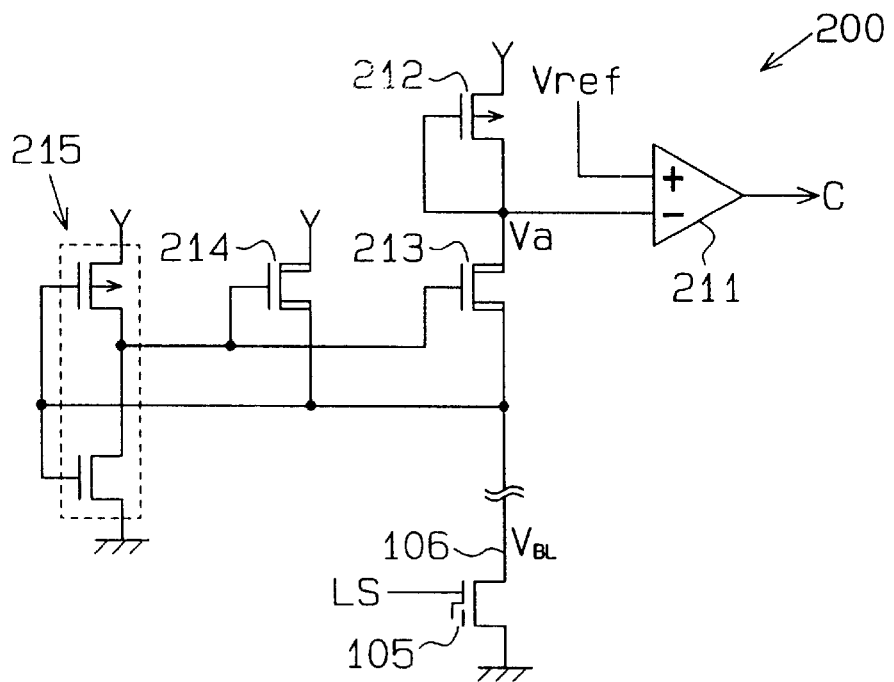
FIG. 3 is a circuit diagram of a sense amp according to a first embodiment of the present invention.
Figure 4:
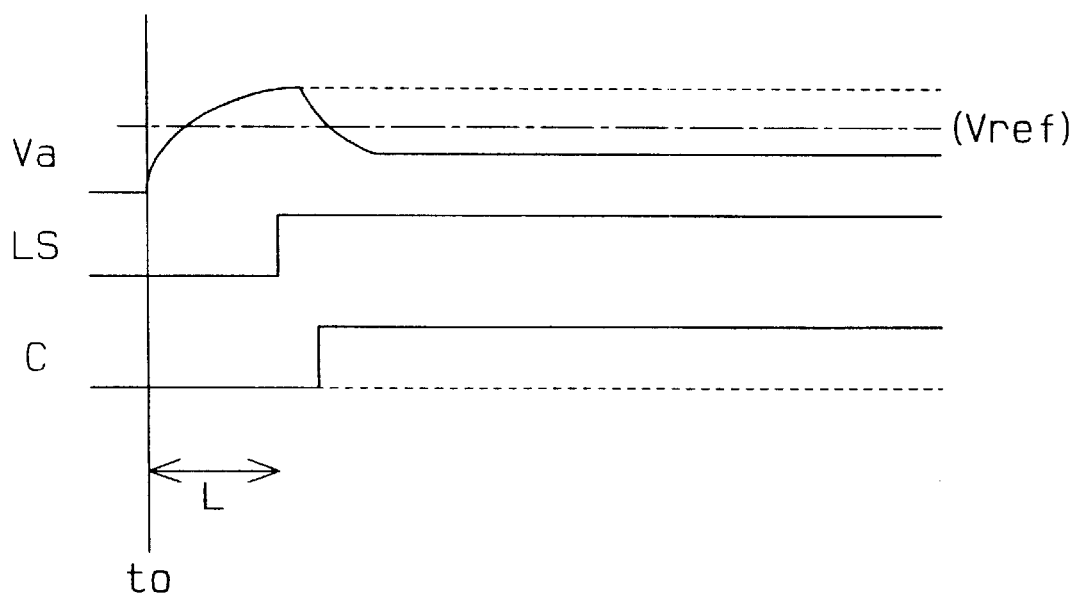
FIG. 4 is an operating waveform diagram of the sense amp of FIG. 3.

FIG. 3 is a circuit diagram of a sense amp 200 according to a first embodiment of the present invention, and FIG. 4 is an operating waveform diagram of the sense amp 200 of FIG. 3. In FIG. 3, the memory cell transistor 105 and the bit line 106 are the same as in FIG. 1.

The sense amp 200 comprises a differential amp 211, a P-channel type MOS transistor 212, two N-channel type MOS transistors 213 and 214, and an inverter 215. The transistor 212 is used as a lead load and the current is supplied by the transistor 212. The transistor 212 has a gate, a drain connected to the gate, and a source connected to a high potential power supply.

The first N-channel transistor 213 is connected between the drain of the transistor 212 and the bit line 106. The second transistor 214 is connected between the high potential power supply and the bit line 106 and has a higher threshold value than the first transistor 213. The first and second transistors 213 and 214 have lower gate capacities than the transistor 212.

The inverter 215 has an input terminal connected to the bit line 106 and an output terminal connected to the first and second transistors 213 and 214. The differential amp 211 has an inverted input terminal to which the drain potential Va of the transistor 212 is applied, and a noninverted input terminal to which the reference potential Vref is applied. The differential amplifier 211 outputs the output signal C indicating the determination result in accordance with the difference between the drain potential Va and the reference potential Vref. The differential amp 211 may be the same as the differential amp 101 shown in FIG. 1.

In the initial state, the memory cell transistor 105 is nonselective (the control gate is off) and the bit line 106 is set to the ground potential. In such a state, as shown in FIG. 4, the power supply is started up at time t0.

Thereupon, the drain potential Va of the transistor 212 rises up near to the power supply potential. The first N-channel transistor 213 and the second N-channel transistor 214 then sequentially go on in response to the initial output startup of the inverter 215. The potential VBL of the bit line 106 also rises with the drain potential Va. At this time, current is supplied not only to the bit line 106 from the high potential power supply through the transistor 212 and the first transistor 213, but also to the bit line 106 from the high potential power supply through the second transistor 214. Hence, the potential VBL of the bit line 106 quickly rises regardless of the drive capacity of the transistor 212. When the inverter 215 slowly starts inversion as the potential VBL of the bit line 106 rises, the first and second N-channel transistors 213 and 214 proceed to the off state, and the potential VBL of the bit line 106 slowly rises. When a specific time L elapses after the startup of the power supply, the drain potential Va of the transistor 212 becomes stable. After the potential Va has become stable, it has a higher potential than the threshold of the inverter 215 only for the threshold of the first N-channel transistor 213 or the second N-channel transistor 214. Thus, the initial setup operation is completed. Because the current is also supplied to the bit line 106 from the second N-channel transistor 214, the time L required for the initial setup operation is shorter than the initial setup of the conventional sense amp 100. In other words, the initial setup time is shortened.

After the initial setup has been completed, the memory cell transistor 105 is selected by the selection signal LS in the same way as the conventional example. Following the selection operation, the potential VBL of the bit line 106 (the drain potential Va of the transistor 212) is determined. In this decision, for example, when the selected memory cell transistor 105 goes on and the potential VBL of the bit line 106 drops, the second N-channel transistor 214 does not go on and only the first N-channel transistor 213 goes on. In other words, when the first N-channel transistor 213 goes on, the drop of the potential VBL of the bit line 106 is weakened by the current that flows in the first N-channel transistor 213, and the potential VBL does not drop lower than the specified potential. Accordingly, the second N-channel transistor 214 does not go on. In other words, the second N-channel transistor 214 has a higher threshold than the first N-channel transistor 213, and the threshold is set such that the second N-channel transistor 214 cannot go on during this decision operation. Thus, the decision operation is performed by the differential amp 211 in the same way as the conventional example.

When the potential VBL of the bit line 106 is read, the transistor 212 used as a load does not function as a main current supply source in the initial setup. Accordingly, the drive capacity of the transistor 212 can be set low so that the variation of the drain potential Va of the transistor 212 can increase. As a result, the sensitivity of the sense amp 200 is increased.

Since the second N-channel transistor 214 has a higher threshold than the first N-channel transistor 213, the threshold of the second N-channel transistor 213 relatively drops, and the drop ratio of the potential VBL of the bit line 106 to the drain potential Va of the transistor 212 is reduced. This is advantageous for a low potential drive.

Figure 5A:
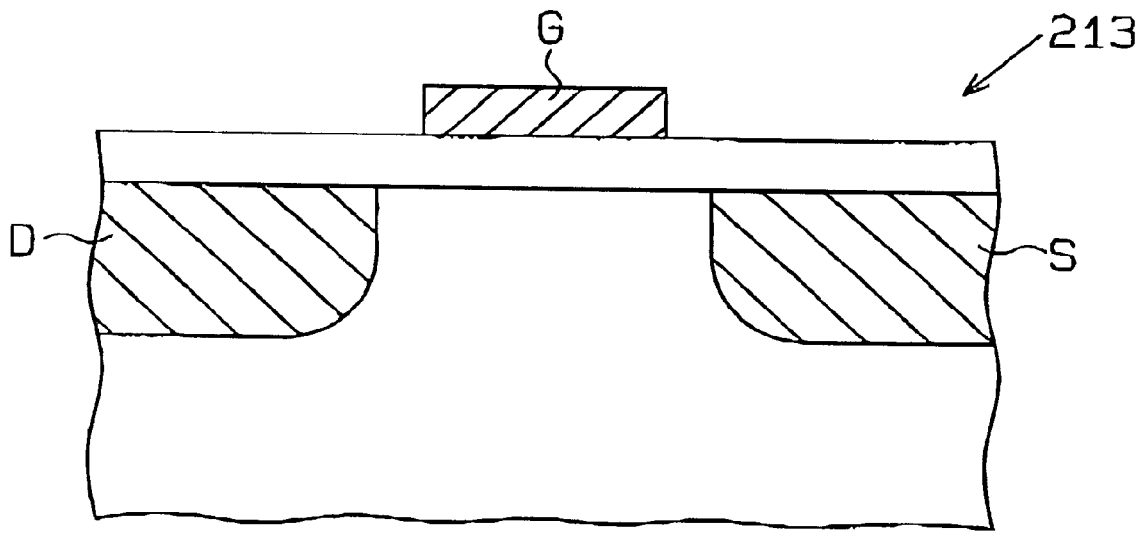
FIG. 5A is a schematic cross-sectional view of a transistor with a gate saving capacity structure in accordance with the present invention.
Figure 5B:
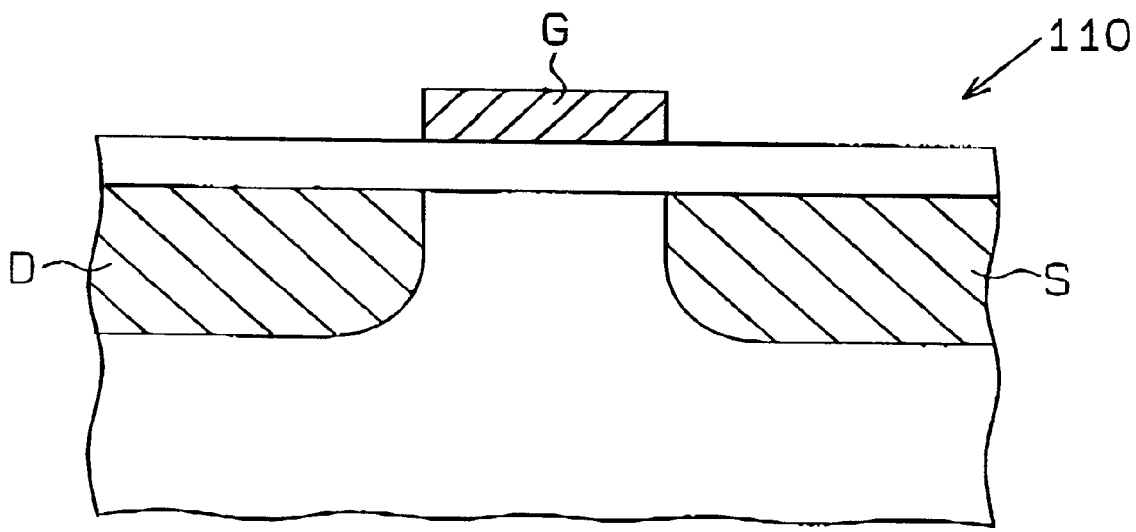
FIG. 5B is a schematic cross-sectional view of a normal MOS transistor.

FIG. 5A is a schematic cross-sectional view illustrating the first N-channel transistor 213 with the gate saving capacity structure (high breakdown voltage). The source region S and the drain region D of the transistor 213 are arranged apart from the gate electrode G. More specifically, a specified clearance is provided between the ends of the source region S and drain region D and the end of the gate electrode G. The second N-channel transistor 214 has the same structure as the first N-channel transistor 213. FIG. 5B is a schematic cross-sectional view illustrating a normal MOS transistor 110. The source region S and drain region D of the transistor 110 are arranged so that the ends substantially match or are in line with the end of the gate electrode G.

In the gate saving capacity type transistor, the breakdown voltage between the source region S or drain region D and the gate electrode G is set relatively high, and the parasitic capacitance of the gate electrode G is set relatively small. The first and second transistors 213 and 214 perform the on/off operation without a large delay even if the inverter 215 has a relatively low drive capacity. Accordingly, the startup time of the sense amp 200 having the first and second transistors 213 and 214 with the gate saving capacity is reduced.

Second Embodiment

Figure 6:
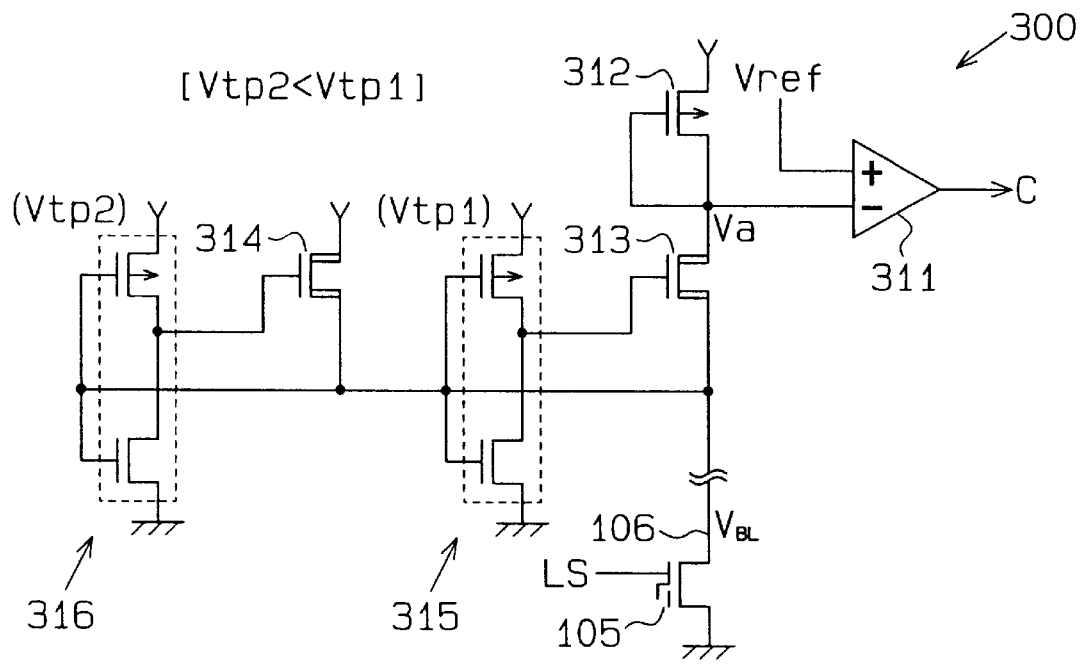
FIG. 6 is a circuit diagram of a sense amp according to a second embodiment of the present invention.

FIG. 6 is a circuit diagram of a sense amp 300 according to the second embodiment of the present invention. The sense amp 300 comprises a differential amp 311, a P-channel type MOS transistor 312, N-channel type MOS transistors 313 and 314, and inverters 315 and 316. The transistor 312 has a gate, a drain connected to the gate, and a source connected to a high potential power supply.

The first transistor 313 is connected between the drain of the transistor 312 and the bit line 106. The second transistor 314 is connected between the high potential power supply and the bit line 106. The first and second transistors 313 and 314 have smaller gate capacities than the transistor 312. The second transistor 314 has a larger transistor size (i.e. current supply capacity) than the first transistor 313.

The first inverter 315 has an input terminal connected to the bit line 106 and an output terminal connected to the gate of the first transistor 313. The second inverter 316 has an input terminal connected to the bit line 106 and an output terminal connected to the gate of the second transistor 314. The threshold Vtp2 of the P-channel transistor for the second inverter 316 is lower than the threshold Vtp1 of the P-channel transistor for the first inverter 315. Accordingly, when the potential VBL of the bit line 106 drops, the second inverter 316 is reversed earlier than the first inverter 315. As a result, the second transistor 314 goes off earlier than the first transistor 313.

The differential amp 311 has an inverted input terminal to which the drain potential Va of the transistor 212 is applied, and a noninverted input terminal to which the reference potential Vref is applied. The differential amp 311 is the same as the differential amp 101 of FIG. 1.

Figure 7:
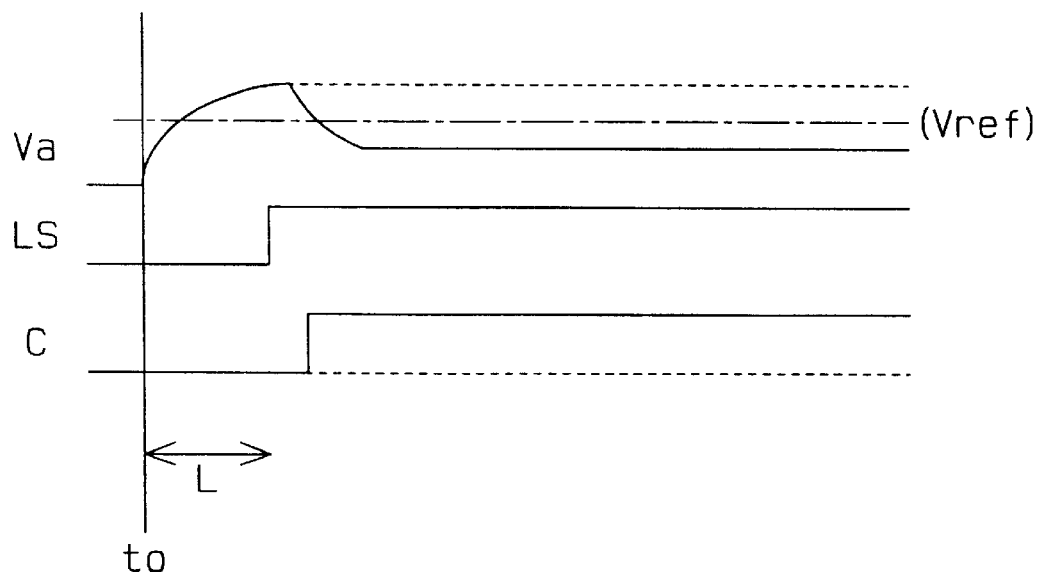
FIG. 7 is an operating waveform diagram of the sense amp of FIG. 6.

In the initial state, the memory cell transistor 105 is nonselective (the control gate is off) and the bit line 106 is set to the ground potential. In such a state, as shown in FIG. 7, the power supply is started up at time t0. Thereupon, the drain potential Va of the transistor 312 rises up near to the power supply potential. The first and second transistors 313 and 314 then go on in response to the output startup of the first and second inverters 315 and 316, and the potential VBL of the bit line 106 rises together with the drain potential Va of the transistor 312. At this time, the current is supplied to the bit line 106 from the high potential power supply through the transistor 312 and the first transistor 313 and to the bit line 106 from the high potential power supply through the second transistor 314. Hence, the potential VBL of the bit line 106 quickly rises regardless of the drive capacity of the transistor 312. When the first and second inverters 315 and 316 slowly start inversion as the potential VBL of the bit line 106 rises, the first and second transistors 313 and 314 proceed to the off state and the potential VBL of the bit line 106 slowly rises.

At this time, since the second inverter 316 having a low threshold is reversed earlier than the first inverter 315, the second transistor 314 goes off earlier than the first transistor 313. Subsequently, the first inverter 315 is reversed and the first transistor 313 goes off. When a specific time L elapses after the startup of the power supply, the drain potential Va of the transistor 312 becomes stable. The potential after the transistor 312 has become stable is set to a higher potential than the threshold of the inverter 315 only for the threshold of the first transistor 313. In the second embodiment, since the current is also supplied to the bit line 106 from the second transistor 314, the initial setup time L is shorter than the initial setup in the conventional example.

After the initial setup has been completed, the memory cell transistor 105 is selected by the selection signal LS and the potential VBL of the bit line 106 is decided. For example, when the memory cell transistor 105 goes on and the potential VBL of the bit line 106 drops, the second inverter 316 is not reversed and only the first inverter 315 is reversed. Hence, the second transistor 314 goes off and the first transistor 313 goes on. In other words, when the first transistor 313 goes on, the drop of the potential VBL of the bit line 106 is weakened by the current applied to the first transistor 313 and the potential VBL does not drop lower than the specified potential. Accordingly, the second inverter 316 is not reversed.

Third Embodiment

Figure 8:
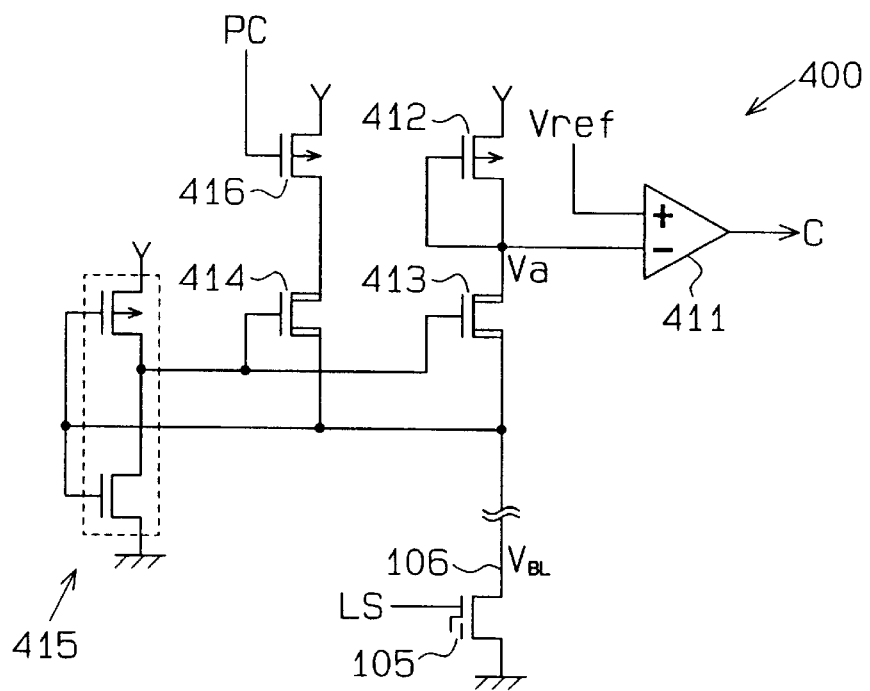
FIG. 8 is a circuit diagram of a sense amp according to a third embodiment of the present invention.

As shown in FIG. 8, a sense amp 400 according to a third embodiment of the present invention is equipped with a differential amp 411, a P-channel type MOS transistor 412, N-channel type MOS transistors 413 and 414, an inverter 415, and a P-channel MOS switching transistor 416. The transistor 412 has a gate, a drain connected to the gate, and a source connected to a high potential power supply. The first transistor 413 is connected between the drain of the transistor 412 and the bit line 106. The second transistor 414 is connected between the switching transistor 416 and the bit line 106. The first and second transistors 413 and 414 have smaller gate capacities than the transistor 412. The second transistor 414 has a larger transistor size (current supply capacity) than the first transistor 413.

Figure 11:
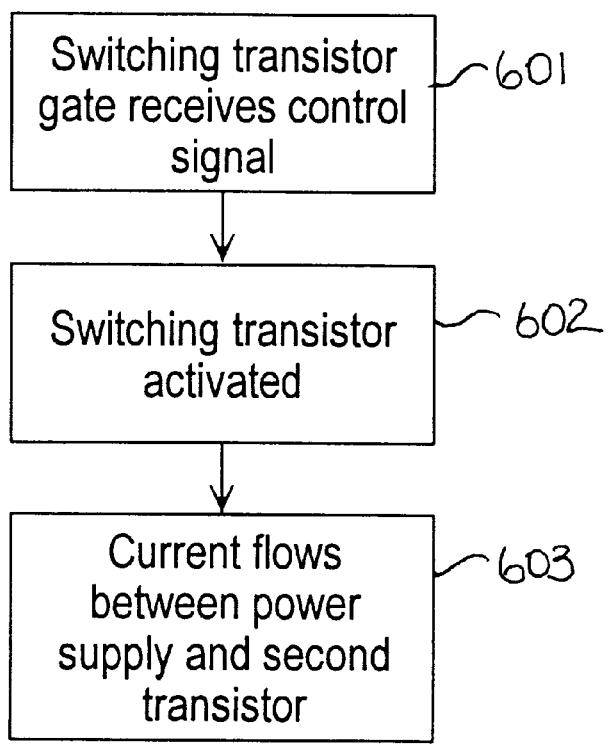
FIG. 11 is a flowchart showing that the switching transistor has a gate receiving a control signal that is activated during an initial setup period in order to supply current from the power supply to the second transistor.

The inverter 415 has an input terminal connected to the bit line 106 and an output terminal connected to the gate of the second transistor 414. The switching transistor 416 is connected between the high potential power supply and the second transistor 414 and has a gate for receiving a control signal PC. When the switching transistor 416 goes on in response to the control signal PC, the power supply potential is supplied to the second transistor 414. As illustrated in FIG. 11, the switching transistor gate receives the control signal at step 601, the switching transistor is activated at step 603 leading to the current flowing between the power supply and the second transistor at step 607. The control signal PC is activated during the initial setup operation period. The switching transistor 416 turns off before the initial setup is completed. As a result, when the initial setup is completed, the current is not supplied from the second transistor 414 to the bit line 106. The differential amp 411 has an inverted input terminal to which the drain potential Va of the transistor 412 is applied, and a noninverted input terminal to which the reference potential Vref is applied.

In the initial state, the memory cell transistor 105 is nonselective (the control gate is off) and the bit line 106 is set to the ground potential. At this time, the control signal PC has a low level state and the switching transistor 416 maintains the on state.

Figure 9:
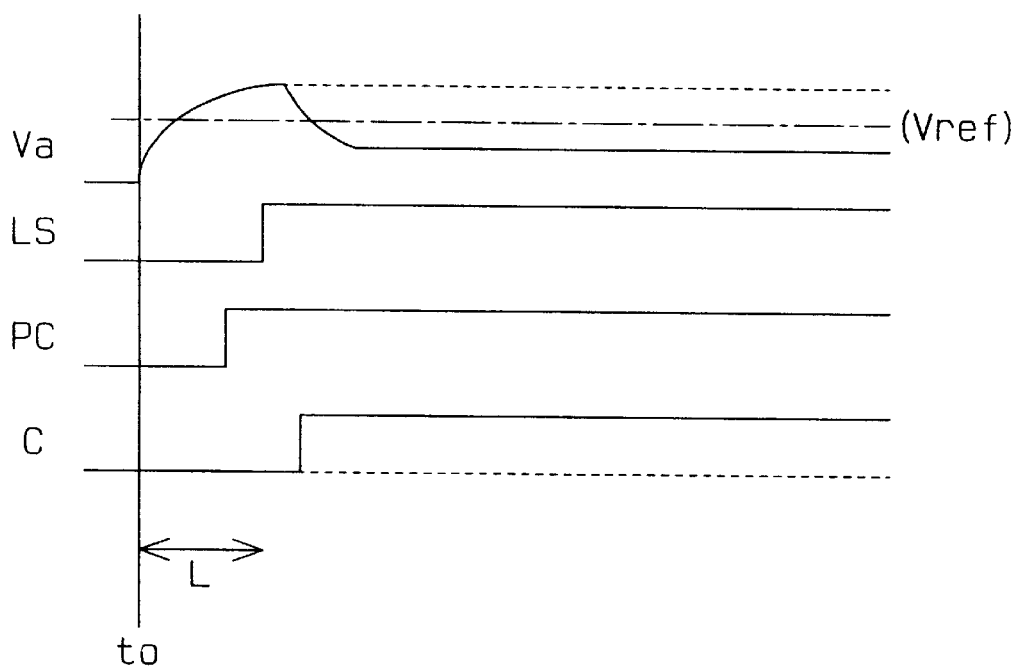
FIG. 9 is an operating waveform diagram of the sense amp of FIG. 8.
Figure 10:
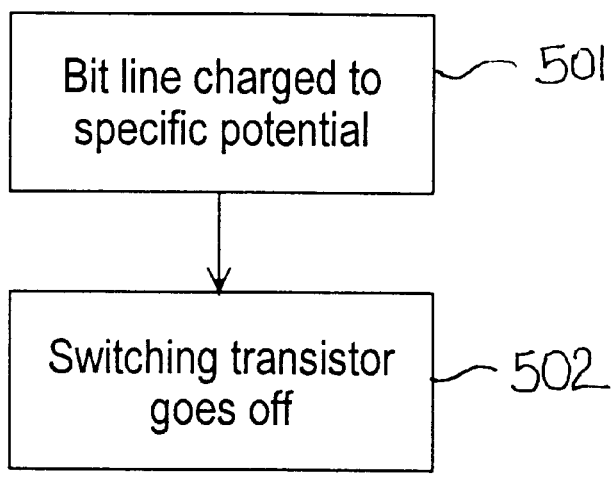
FIG. 10 is a flowchart showing that the switching transistor operates to go off after the bit line has been charged to a specified potential.

In such a state, as shown in FIG. 9, the power supply is started up at time t0. Thereupon, the first and second transistors 413 and 414 go on, and the drain potential Va of the transistor 412 and the potential VBL of the bit line 106 rise. At this time, since the current is supplied from the power supply to the bit line 106 through the transistor 412, the first and second transistors 413 and 414 go on, the potential VBL of the bit line quickly rises. When the inverter 415 slowly starts inversion as the potential VBL of the bit line 106 rises, the first and second transistors 413 and 414 proceed to the off state and the potential VBL of the bit line 106 slowly rises. At this time, the control signal PC is activated and the switching transistor 416 is turned off. Thus, the supply of the current from the second transistor 414 is disconnected. When a specific time L elapses after the startup of the power supply, the drain potential Va of the transistor 412 becomes stable. The potential after it has become stable is set to a higher potential than the threshold of the inverter 415 only for the threshold of the first transistor 413. At this time, the switching transistor 416 is turned off and the current is supplied to the bit line 106 through the first transistor 413. In other words, the switching transistor goes off after the bit line has been charged to a specified potential. FIG. 10 illustrates the bit line charged to a specific potential at step 501 followed by the switching transistor going off at step 503. Thus, the initial setup is completed. Accordingly, the drain potential Va of the transistor 412 with sufficient size is obtained early, and the initial setup operation time is shortened.

After the initial setup has been completed, the memory cell transistor 105 is selected and the potential VBL of the bit line 106 (the drain potential Va of the transistor 412) is decided in the same way as the conventional example. In the decision operation of the potential VBL of the bit line 106, since both the switching transistor 416 and second transistor 414 are off, the current is applied to the bit line 106 through only the first transistor 413.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A sense amp for supplying a current to a bit line connected to a first potential through a memory cell transistor and detecting a potential of the bit line, which varies according to a conductive state of the memory cell transistor, comprising:

a load element connected to a second potential;

a first transistor connected between said load element and the bit line, wherein said first transistor is connected to the second potential via said load element;

a second transistor connected between the second potential and the bit line, wherein said second transistor has a higher threshold than said first transistor, and wherein one of a source and a drain of said second transistor is directly connected to the second potential;

an inverter having an input terminal connected to the bit line and an output terminal connected to the gates of said first and second transistors; and a differential amp having a first input terminal connected between said load element and said first transistor, a second input terminal that outputs signal indicating the potential detection result of the bit line.

2. The sense amp according to claim 1, wherein each of said first and second transistors has its gate electrode arranged apart from its source region and its drain region.

3. A sense amp for supplying a current to a bit line connected to a first potential through a memory cell transistor and detecting a potential of the bit line, which varies according to a conductive state of the memory cell transistor, comprising:

a load element and a first transistor connected in series between a second potential and the bit line;

a second transistor connected between the second potential and the bit line;

a first inverter that has an input terminal connected to the bit line and an output terminal connected to the gate of said first transistor;

a second inverter having an input terminal connected to the bit line and an output terminal connected to the gate of said second transistor, wherein said second inverter has a lower threshold than said first inverter; and a differential amp having a first input terminal connected to a node between said load element and said first transistor, a second input terminal connected to a reference potential, and an output terminal that outputs a signal indicating the potential detection result of the bit line.

4. The sense amp according to claim 3, wherein said second transistor has a higher current supply capacity than said first transistor.

5. The sense amp according to claim 3, wherein each of said first and second transistors has its gate arranged apart from its source region and its drain region.

6. A sense amp for supplying a current to a bit line connected to a first potential through a memory cell transistor and detecting a potential of the bit line, which varies according to a conductive state of the memory cell transistor, comprising:

a load element and first transistor connected in series between a second potential and the bit line;

a switching transistor and a second transistor connected in series between the second potential and the bit line, wherein one of a source and a drain of said switching transistor is directly connected to the second potential;

an inverter having an input terminal connected to the bit line and an output terminal connected to the gates of said first and second transistor; and a differential amp having a first input terminal connected to a node between said load element and said first transistor, a second input terminal connected to a reference potential, and an output terminal that outputs a signal indicating the potential detection result of the bit line.

7. The sense amp according to claim 6, wherein said switching transistor is controlled to go off in response to a control signal after the bit line has been charged to a specified potential.

8. The sense amp according to claim 6, wherein each of said first and second transistors has its gate arranged apart from its source and its drain.

9. A sense amp for supplying a current to a bit line connected to a first potential through a memory cell transistor and detecting a potential of the bit line, which varies according to a conductive state of the memory cell transistor, comprising:

a load element and a first transistor connected in series between a second potential and the bit line;

a switching transistor and a second transistor connected in series between the second potential and the bit line;

an inverter having an input terminal connected to the bit line and an output terminal connected to the gates of said first and second transistors; and a differential amp having a first input terminal connected to a node between said load element and said first transistor, a second input terminal connected to a reference potential, and an output terminal that outputs a signal indicating the potential detection result of the bit line, wherein said second transistor has a higher current supply capacity than the first transistor.

10. A sense amp for supplying current to a bit line connected to a memory cell transistor and detecting a potential of the bit line, which varies according to a conductive state of the memory cell transistor, the sense amp comprising:

a load element;

a first transistor, wherein said load element and said first transistor are connected in series between a first potential and the bit line;

a second transistor connected between the first potential and the bit line, wherein said second transistor turns on when a current is supplied to the bit line;

a first inverter having an input terminal connected to the bit line and an output terminal connected to a gate of said first transistor; and a differential amp having a first input terminal connected to a reference potential, a second input terminal connected to a node between said load element and said first transistor, and an output terminal that outputs a signal indicating a difference between the reference potential and the bit line potential, wherein the output terminal of said first inverter is connected to a gate of said second transistor, and wherein said second transistor has a higher current supply capacity than said first transistor.

11. The sense amp of claim 10, further comprising:

a second inverter having an input terminal connected to the bit line and to the gate of said first inverter and an output terminal connected to a gate of said second transistor.

12. The sense amp of claim 11, wherein for each of said first and second transistors, a source region and a drain region are arranged apart from the gate electrode so that the first and second transistors have a gate saving capacity structure.

13. The sense amp of claim 11, wherein the first and second inverters are constructed so that when the potential of the bit line drops, the output of said second inverter changes faster than the output of said first transistor.

14. The sense amp of claim 13, wherein for each of said first and second transistors, a source region and a drain region are arranged apart from the gate electrode so that the first and second transistors have a gate saving capacity structure.

15. The sense amp of claim 10, wherein for each of said first and second transistors, a source region and a drain region are arranged apart from the gate electrode so that the first and second transistors have a gate saving capacity structure.

16. The sense amp of claim 10, further comprising:

a switching transistor connected between said second transistor and the first potential and having a gate receiving a control signal that is activated during an initial setup period in order to supply current from the first potential to the second transistor.

17. The sense amp of claim 16, wherein for each of said first and second transistors, a source region and a drain region are arranged apart from the gate electrode so that the first and second transistors have a gate saving capacity structure.

* * * * *